(12) United States Patent
Joseph et al.

(10) Patent No.: US 7,709,325 B2
(45) Date of Patent: May 4, 2010

(54) METHOD OF FORMING RING ELECTRODE

(75) Inventors: Eric A. Joseph, White Plains, NY (US);
Chung H. Lam, Peekskill, NY (US);
Alejandro G. Schrott, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 230 days.

(21) Appl. No.: 12/043,228

(22) Filed: Mar. 6, 2008

(65) Prior Publication Data

US 2009/0227066 A1  Sep. 10, 2009

(51) Int. Cl.
*H01L 21/8234* (2006.01)
*H01L 21/8244* (2006.01)
*H01L 21/336* (2006.01)
*H01L 21/44* (2006.01)

(52) U.S. Cl. .................. 438/266; 438/261; 438/238; 438/652; 257/E21.589

(58) Field of Classification Search ............. 438/266, 438/261, 238, 652
See application file for complete search history.

(56) References Cited

U.S. PATENT DOCUMENTS

| | | | |
|---|---|---|---|
| 7,589,344 B2* | 9/2009 | Sato | 257/4 |
| 2006/0076641 A1* | 4/2006 | Cho et al. | 257/528 |
| 2007/0018149 A1* | 1/2007 | Sato | 257/4 |
| 2007/0063180 A1* | 3/2007 | Asano et al. | 257/3 |
| 2007/0097737 A1* | 5/2007 | Asano et al. | 365/163 |
| 2007/0278529 A1* | 12/2007 | Lai et al. | 257/209 |
| 2008/0179585 A1* | 7/2008 | Hsu | 257/4 |
| 2009/0111228 A1* | 4/2009 | Breitwisch et al. | 438/261 |
| 2009/0268507 A1* | 10/2009 | Breitwisch et al. | 365/148 |

* cited by examiner

*Primary Examiner*—David A Zarneke
(74) *Attorney, Agent, or Firm*—Scully, Scott, Murphy & Presser, P.C.; Vazken Alexanian (57) ABSTRACT

The present invention in one embodiment provides a method of forming an electrode that includes the steps of providing at least one metal stud in a layer of an interlevel dielectric material; forming a pillar of a first dielectric material atop the at least one metal stud; depositing an electrically conductive material atop the layer of the interlevel dielectric material and an exterior surface of the pillar, wherein a portion of the electrically conductive material is in electrical communication with the at least one metal stud; forming a layer of a second dielectric material atop the electrically conductive material and the substrate; and planarizing the layer of the second dielectric material to expose an upper surface of the electrically conductive material.

19 Claims, 5 Drawing Sheets

METHOD OF FORMING RING ELECTRODE

FIELD OF THE INVENTION

In one embodiment, the present invention relates to electrode contacts to electrical devices. In another embodiment, the present invention relates to memory devices.

BACKGROUND OF THE INVENTION

In semiconductor and memory device applications, an electrode is a conductor through which electric current is passed. An electrode may be composed of a metal, such as copper, tungsten, silver, lead, or zinc. An electrode may also be in the form of a nonmetallic conductor including a semiconducting material, such as doped polysilicon.

Phase change memory (PCM) devices store data using a phase change material, such as, for example, a chalcogenide alloy, that transforms into a crystalline state or an amorphous state. An electrode may provide a current through the PCM device to produce heat that effectuates phase changes in the PCM between the crystalline and the amorphous phases. Each state of the phase change material has different resistance characteristics. Specifically, the phase change material in the crystalline state has low resistance and the phase change material in the amorphous state has high resistance. The crystalline state is typically referred to as a "set state" having a logic level "0", and the amorphous state is typically referred to as a "reset state" having a logic level "1".

SUMMARY OF THE INVENTION

The present invention, in one aspect provides a method of forming an electrode. In one embodiment, the inventive method comprises:

providing at least one metal stud present in a layer of an interlevel dielectric material;

forming a pillar of a first dielectric material atop the at least one metal stud;

depositing an electrically conductive material atop the layer of the interlevel dielectric material and an exterior surface of the pillar of the first dielectric material, wherein a portion of the electrically conductive material is in electrical communication with the at least one metal stud;

forming a layer of a second dielectric material atop at least the electrically conductive material and the layer of the interlevel dielectric material; and removing a portion of the layer of the second dielectric material to expose an upper surface of the electrically conductive material present on a sidewall of the pillar of the first dielectric material.

In one embodiment, the upper surface of the electrically conductive material present on the sidewall of the pillar of the first dielectric material when depicted from a top view has a ring geometry, which may be referred to as a ring electrode. In one embodiment, the electrically conductive material is in electrical communication with at least one metal stud. In one embodiment, the electrically conductive material is titanium nitride (TiN). In one embodiment, the at least one metal stud that is in electrical contact with the electrically conductive material is composed of tungsten (W).

In one embodiment, the step of forming the pillar of the first dielectric material atop the at least one metal stud comprises depositing a layer of the first dielectric material atop the at least one metal stud and the interlevel dielectric layer; depositing a photoresist layer atop the layer of the first dielectric material; patterning the photoresist layer to protect a portion of the layer of the first dielectric material that is overlying a portion of the at least one metal stud, wherein a remaining portion of the layer of the first dielectric material is exposed; and etching the remaining portion of the layer of the first dielectric material.

In one embodiment, following the step of patterning the photoresist layer, the method further includes trimming the photoresist layer that is protecting the portion of the first dielectric material, wherein a width of a trimmed photoresist layer is less than the width of the at least one metal stud. In one embodiment, trimming of the patterned photoresist layer comprises isotropic reactive ion etching. In one embodiment, the step of depositing the electrical conductive material atop the interlevel dielectric layer and the exterior surface of the pillar includes a conformal deposition process. In one embodiment, the conformal deposition process is chemical vapor deposition, such as atomic layer deposition.

In one embodiment, the step of forming the layer of the second dielectric material atop the electrically conductive material and the interlevel dielectric layer includes forming spacers abutting the electrically conductive material that is present on at least the sidewalls of the pillar; and then depositing the layer of the second dielectric material by high density plasma chemical vapor deposition (HDPCVD). In one embodiment, the step of planarizing the layer of the second dielectric material includes chemical mechanical polishing (CMP) of the layer of the second dielectric material and the portion of the electrically conductive material that is present on an upper surface of the pillar of the first dielectric material.

In another aspect, the present invention provides a method of manufacturing a memory device. In one embodiment, the method of manufacturing a memory device includes:

providing at least one metal stud positioned in a layer of an interlevel dielectric material;

forming a pillar of a first dielectric material atop the at least one metal stud;

depositing an electrically conductive material atop the layer of the interlevel dielectric material and an exterior surface of the pillar of the first dielectric material, wherein a portion of the electrically conductive material is in electrical communication with the at least one metal stud;

forming a layer of a second dielectric material atop the electrically conductive material and the layer of the interlevel dielectric material;

removing a portion of the layer of the second dielectric material to expose an upper surface of the electrically conductive material; and forming a phase change memory cell in contact with the upper surface of the electrically conductive material.

In one embodiment, the at least one metal stud is composed of tungsten (W) and the electrically conductive material is composed of titanium nitride (TiN). In one embodiment, the first dielectric material is composed of a boron phosphor silicate glass (BPSG) oxide. In one embodiment, the second dielectric material is composed of silicon nitride (SiN). In one embodiment, the layer of the first dielectric material has a thickness ranging from about 20 nm to about 300 nm, and the layer of the second dielectric material has a thickness ranging from about 30 nm to about 500 nm.

In one embodiment, the step of forming the phase change memory cell includes depositing a layer of a phase change material atop an exposed surface of the electrically conductive material. In one embodiment, the phase change material comprises Ge, Sb, Te or a combination thereof. In one embodiment, the deposition of the phase change material includes chemical vapor deposition. In one embodiment, the phase change memory cell further comprises a layer of TiN atop the phase change material.

BRIEF DESCRIPTION OF THE DRAWINGS

The following detailed description, given by way of example and not intended to limit the invention solely thereto, will best be appreciated in conjunction with the accompanying drawings, wherein like reference numerals denote like elements and parts, in which.

DETAILED DESCRIPTION OF THE INVENTION

Detailed embodiments of the present invention are disclosed herein; however, it is to be understood that the disclosed embodiments are merely illustrative of the invention that may be embodied in various forms. In addition, each of the examples given in connection with the various embodiments of the invention are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the present invention.

The embodiments of the present invention relate to novel methods for forming electrodes and memory devices. When describing the methods, the following terms have the following meanings, unless otherwise indicated.

As used herein, the term "memory device" means a structure in which the electrical state of thereof can be altered and then retained in the altered state; in this way a bit of information can be stored.

"Volatile memory" means memory in which stored information is lost when power to the memory cell is turned off.

"Non-volatile memory" means memory in which information stored is maintained after the power supply is turned off.

As used herein, an "anisotropic etch process" denotes a material removal process in which the etch rate in the direction normal to the surface to be etched is greater than in the direction parallel to the surface to be etched.

As used herein, "insulating" denotes a material having a room temperature conductivity of less than about $10^{-10}(\Omega\text{-m})^{-1}$.

"Electrically conductive" and/or "electrically communicating" as used through the present disclosure means a material typically having a room temperature conductivity of greater than $10^{-8}(\Omega\text{-m})^{-1}$.

The term "electrical contact" denotes direct physical contact between two materials, wherein the interface between the two materials is electrically conductive.

The terms "direct physical contact" or "abutting" mean that the two structures are in contact without any intermediary conducting, insulating or semiconducting structures.

The terms "overlying", "underlying", "atop", and "on" define a structural relationship in which two structures are in contact where an intermediary structure of a conducting, insulating, or semiconducting material may or may not be present at the interface of the two structures.

As used herein, a "via" refers to a hole formed in a dielectric which is then filled with metal to provide vertical connection between stacked up interconnect metal lines and/or devices.

As used herein, a "metal stud" refers to the metal formed within a via.

As used herein, a "metal" is an electrically conductive material, wherein in metal atoms are held together by the force of a metallic bond; and the energy band structure of metal's conduction and valence bands overlap, and hence, there is no energy gap.

As used herein, a "phase change material" denotes a material that converts from an amorphous phase to a crystalline phase or vice versa upon the application of energy.

As used herein, a "barrier metal" is a material used to chemically isolate the phase change material from metals and provides an electrical contact between them.

As used herein, a "dielectric" is a non-metallic solid displaying insulating properties.

As used herein, the term "resistive memory device" denotes a device whose effective electrical resistivity can be switched between two or more resistivity states upon an application of an energy pulse, such as a voltage or current pulse. Pulse time may range from approximately 5 nanoseconds to approximately $5 \times 10^5$ nano-seconds.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the invention, as it is oriented in the drawing figures.

FIGS. 1 to 9 depict embodiments of the present method for forming an electrode that may be utilized to provide electrical contact to a memory cell. The electrode is self-aligned to a dielectric pillar, because the electrode is formed on the sidewalls of a dielectric pillar overlying the metal stud.

Figure 1:
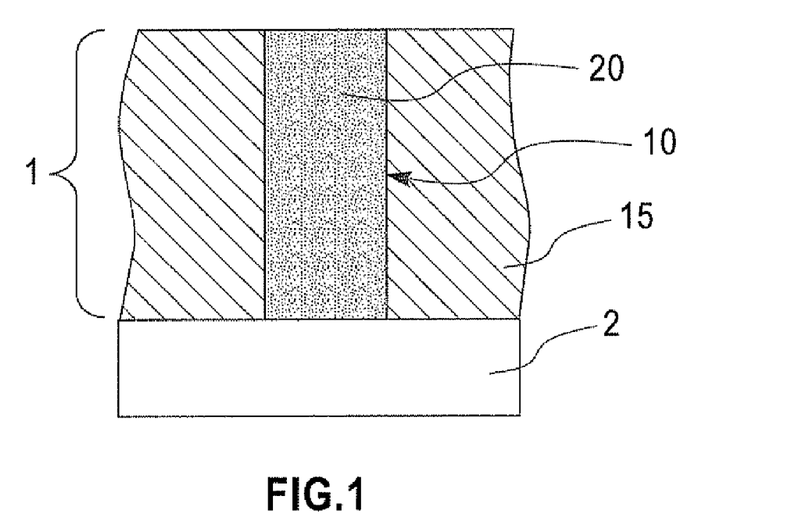
FIG. 1 is a side cross sectional view of an initial structure including a metal stud present in an interlevel dielectric layer, as used in accordance with one embodiment of the present invention.

FIG. 1 depicts one embodiment of an interconnect level 1 atop a substrate 2, such as a semiconducting wafer. In one embodiment, the present method may begin following front end of the line (FEOL) processing, in which a device interconnect level 1 is provided that includes a layer of an interlevel dielectric material 15 having a plurality of openings 10 that are filled with at least one conductive material, such as a metal stud 20 or bar (not shown). In one embodiment, the layer of the interlevel dielectric material 15 may include a metal stud 20 that provides electrical conductivity to an interlevel terminal (source/drain) of a select/access transistor (not shown) that is formed within or upon the underlying substrate 2. In one embodiment, the layer of the interlevel dielectric material 15 may also include at least one metal bar (not shown), wherein the metal bar is a conducting line that may be used to provide electrical conductivity to the second terminal (source/drain) of a select/access transistor positioned in the underlying substrate 2. In one embodiment, the layer of the interlevel dielectric material 15 may further include a lower conductive line (not shown). The lower conductive line may be a word line, which may bias the gate of the select/access transistor that links the metal stud 20 with the metal bar.

The substrate 2 may include any number of active and/or passive devices (or regions) located within the substrate 2 or on a surface thereof. For clarity, the active and/or passive devices (or regions) are not shown in the drawings, but are nevertheless meant to be included with substrate 2. For example, the substrate 2 may comprise any semiconductor material including, but not limited to: Si, Ge, SiGe, SiC, SiGeC, InAs, GaAs, InP and other III/V compound semiconductors. The substrate 2 may be undoped, or doped. In one example, the doping of a Si-containing substrate may be light (having a dopant concentration of less than 1E17 atoms/cm$^3$) or heavy (having a dopant concentration of about 1E17 atoms/cm$^3$ or greater). The substrate 2 can have any crystallographic orientation such as (100), (110) or (111). Hybrid substrates having at least two planar surfaces of different crystallographic orientation are also contemplated.

In one embodiment, the interconnect level 1 is formed atop the substrate 2 using deposition, etching and planarization. More specifically, in one embodiment of the invention, the layer of the interlevel dielectric material 15 is formed atop the substrate 2 by a deposition process including, for example, chemical vapor deposition (CVD), plasma-assisted CVD, evaporation, spin-on coating, or chemical solution deposition. "Chemical Vapor Deposition" is a deposition process in which a deposited species is formed as a results of chemical reaction between gaseous reactants at greater than room temperature (25° C. to 600° C.); wherein solid product of the reaction is deposited on the surface on which a film, coating, or layer of the solid product is to be formed. The layer of the interlevel dielectric material 15 includes any suitable insulating material that is typically employed in interconnects to electrical devices. This includes inorganic dielectrics, organic dielectrics and combinations thereof, including, multilayers thereof. Illustrative examples of suitable materials for the layer of the interlevel dielectric material 15 include, but are not limited to: $SiO_2$, Boron Phosphor Silicate Glass (BPSG) oxide, fluorinated $SiO_2$, $Si_3N_4$, organic thermoset or thermoplastic dielectrics such as polyimides, polyarylenes, benzocyclobutenes and the like, spun-on glasses including organo-silicate glass (OSG), with or without porosity, such as hydrogen silsesquixoane, methyl silsesquixoane, tetraethylorthosilicate (TEOS) and the like, amorphous alloys of Si, O, C and H, or SiCOH, amorphous alloys of Si, O, F and H.

In one embodiment, the layer of the interlevel dielectric material 15 comprises a low-k dielectric having a thickness ranging from about 10 nm to about 1000 nm. In another embodiment, the layer of the interlevel dielectric material 15 has a thickness on the order of about 300 nm. In one embodiment, the dielectric constant of the interlevel dielectric material may be less than about 3.5. In another embodiment, the interlevel dielectric material may have a dielectric constant that is from about 1.0 to about 3.0. Low-k dielectrics may include organic dielectrics such as low dielectric constant polymer dielectrics or may include low dielectric constant carbon-doped oxides. One example of a low-k dielectric polymer dielectric is SiLK™. Specifically, SiLK™ is a class of polymer-based low-k dielectric materials comprising a b-staged polymer having a composition including about 95% carbon. An example of a low dielectric constant carbon doped oxide is SiCOH.

After forming the layer of the interlevel dielectric material 15 on the surface of the substrate 2, openings 10 are formed into the layer of the interlevel dielectric material 15 so as to expose portions of the underlying substrate 2, in which device interconnects, such as metal studs 20 and/or metal bars are subsequently formed. In one embodiment, the openings 10 are provided with a circular cross section when viewed from the top view. The openings 10, hereafter referred to as vias, are formed utilizing conventional lithography and etching. For example, the lithographic step may include applying a photoresist to the interlevel dielectric layer 15, exposing the photoresist to a pattern of radiation and developing the pattern into the exposed photoresist utilizing a resist developer. The etching step used in providing the vias 10 into the layer of the interlevel dielectric material 15 includes chemical reactive ion etching (RIE), plasma etching, ion beam etching or laser ablation. "Reactive Ion Etching" is a form of plasma etching, in which the surface to be etched is placed on an RF powered electrode, wherein the surface to be etched takes on a potential that accelerates an etch species that is extracted from a plasma towards the surface to be etched, in which the chemical etching reaction on the surface to be etched is in the direction normal to the surface. Following etching, the photoresist is typically removed from the structure utilizing a resist stripping process, such as oxygen ashing.

In one embodiment, device interconnects, such as metal studs 20 and metal bars, are then formed within the vias 10 in the interlevel dielectric layer 15 using deposition and planarization processes. In one embodiment, a conductive material, such as Cu or W, is then formed utilizing a deposition process, such as plating or sputtering, filling at least the vias 10. After filling the vias 10 with a conductive material, the structure is typically subjected to a planarization process, such as chemical-mechanical polishing or grinding, to provide a planar structure, as depicted in FIG. 1. Note that each top surface of the metal studs 20 is substantially coplanar with the abutting top surface of the layer of the interlevel dielectric material 15. In one embodiment, a liner of a barrier material is positioned between the metal stud 20 and the sidewall of the via through the layer of the interlevel dielectric material 15.

In one embodiment, the width $W_2$ of the metal studs 20 is less than 500 nm. In another embodiment, the width $W_2$ of the metal studs 20 ranges from about 50 nm to about 150 nm. In yet another embodiment, the width $W_2$ the metal studs 20 ranges from about 50 nm to about 100 nm.

Figure 2:
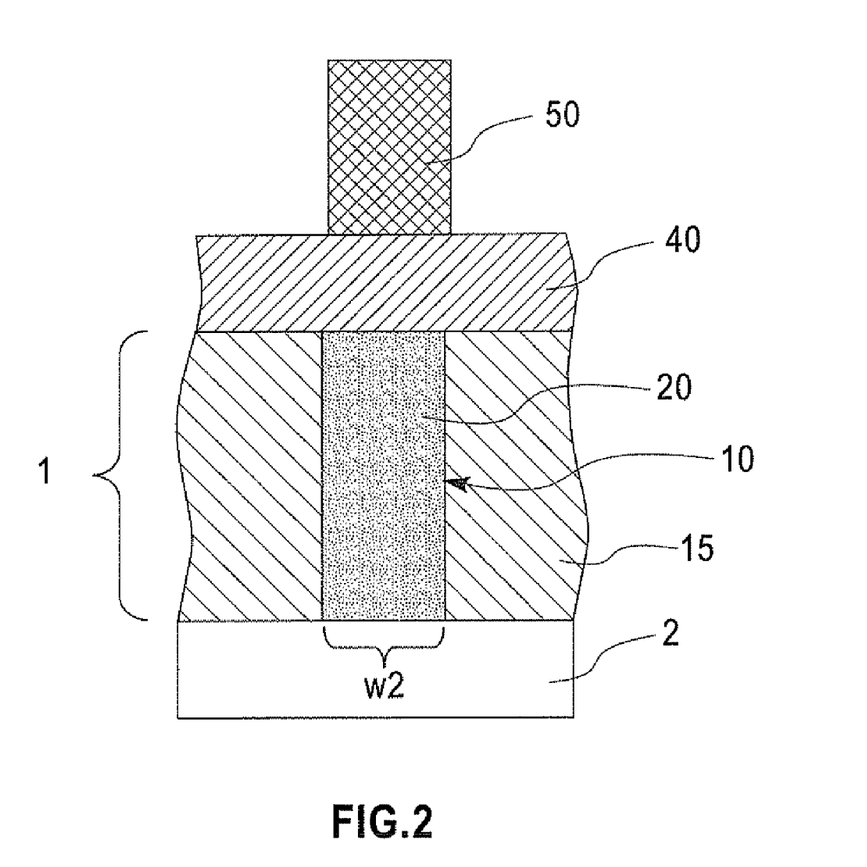
FIG. 2 is a side cross sectional view depicting forming a layer of a first dielectric material atop the initial structure and forming a patterned photoresist layer overlying the at least one metal stud, in accordance with one embodiment of the present invention.

FIG. 2 is a side cross sectional view depicting the formation of a layer of a first dielectric material 40 atop the metal stud 20 and the layer of the interlevel dielectric material 15; and forming a patterned photoresist layer 50 (also referred to as photoresist mask 50) overlying the at least one metal stud 20. In one embodiment, the layer of the first dielectric material 40 is deposited atop the metal stud 20. Similar to the layer of the interlevel dielectric material 15, the layer of the first dielectric material 40 may be composed of any suitable insulating material that is typically employed in interconnects to electrical devices. The layer of the first dielectric material 40 may comprise the same or a different dielectric from the layer of the interlevel dielectric material 15. In one embodiment, the layer of the first dielectric material 40 may be composed of silicon nitride (SiN) having a thickness ranging from about 10 nm to about 300 nm. In one embodiment, the dielectric constant of the layer of the first dielectric material 40 may range from about 2 to about 100. In one embodiment, the layer of the first dielectric material 40 is formed by a deposition process including, for example, chemical vapor deposition (CVD), plasma-assisted CVD, evaporation, spin-on coating, or chemical solution deposition.

Following formation of the layer of the first dielectric material 40, an etch mask is formed overlying at least one the metal stud 20 using deposition and photolithography. For example, in one embodiment, the etch mask may be provided by a patterning a photoresist layer. In one embodiment, the steps of patterning a photoresist layer may include applying a photoresist layer to the layer of the first dielectric material 40, exposing the photoresist layer to a pattern of radiation corresponding to the underlying metal stud 20, and developing the pattern into the exposed photoresist layer utilizing a resist developer to provide a patterned photoresist mask 50 (hereafter referred to as photoresist mask 50) that protects a portion of the layer of the first dielectric material 40 that is overlying at least a portion of the metal stud 20. In another embodiment, a hardmask composed of a dielectric material may be utilized as an etch mask instead of the photoresist mask 50.

Figure 3:
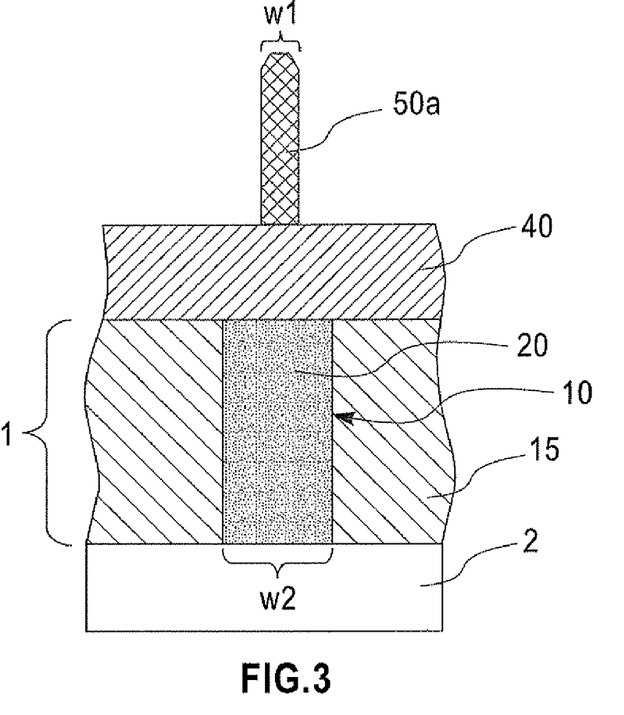
FIG. 3 is a side cross sectional view depicting trimming the patterned photoresist layer, in accordance with at least one embodiment of the present invention.

FIG. 3 depicts one embodiment of trimming the photoresist mask 50, i.e., a patterned photoresist layer, wherein the width $W_1$ that of the trimmed photoresist mask 50a is less than the width $W_2$ of the metal stud 20. In one embodiment, the trimmed photoresist mask 50a may have a sublithographic dimension. The term "sublithographic" means less than the smallest dimension obtainable by lithography. At the 22 nm technology node, the smallest dimension obtainable by lithography is about or less than 22 nm. In one embodiment, trimming further includes isotropic reactive ion etch (RIE) in an $O_2$/HBr/Ar plasma chemistry.

In one embodiment, the width $W_1$ of the trimmed photoresist mask 50a is less than 100 nm. In another embodiment, the width $W_1$ of the trimmed photoresist mask 50a ranges from about 30 nm to about 80 nm. In yet another embodiment, the width $W_1$ of the trimmed photoresist mask 50a ranges from about 10 nm to about 50 nm.

Figure 4:
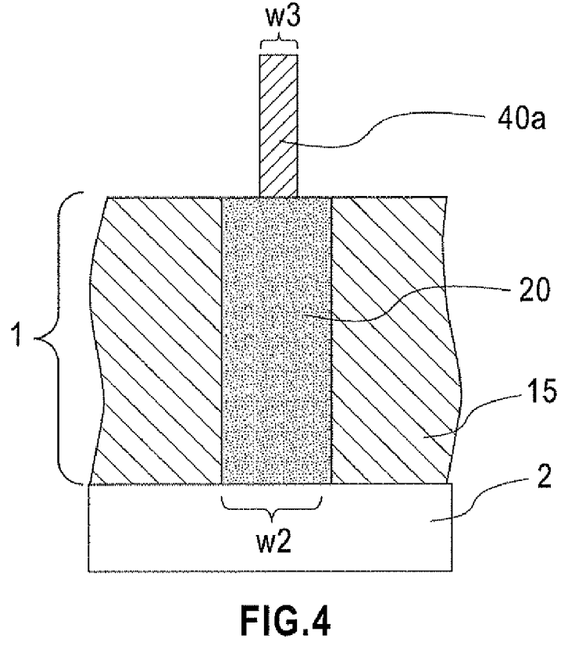
FIG. 4 is a side cross sectional view depicting etching the layer of the first dielectric material using the trimmed photoresist layer as an etch mask to provide a pillar of the first dielectric material overlying the at least one metal stud, in accordance with one embodiment of the present invention.

Referring to FIG. 4, following the formation of the trimmed photoresist mask 50a, the exposed portions of the layer of the first dielectric material 40 are etched using an anisotropic etch process, e.g., reactive ion etching, selective to the metal stud 20 and the layer of the interlevel dielectric material 15. In one embodiment, the metal studs 20 are composed of tungsten (W) and the layer of the first dielectric material 40 is composed of silicon nitride (SiN), etching the layer of the first dielectric material 40 includes reactive ion etch processing with a fluorocarbon containing plasma chemistry. In another embodiment, the fluorocarbon feedgas chemistry used in the RIE process may contain $CF_4$, $CHF_3$, $C4F_8$, $C5F_8$ or $C4F_6$. In another embodiment, in which the metal studs 20 are composed of Cu and the layer of the first dielectric material 40 is composed of silicon nitride (SiN), the etch chemistry that removes the first dielectric material 40 composed of silicon nitride (SiN) selective to the metal stud 20 composed of copper (Cu) is an ammonium per sulfide (($NH_4)_2S_2O_8$) solution. In another embodiment, the etch chemistry that removes the first dielectric material 40 composed of silicon nitride (SiN) selective to the metal stud 20 composed of copper (Cu) is a sulfiric acid ($H_2SO_4$) solution. Following etch of the layer of the first dielectric material 40, the trimmed photoresist mask 50a is removed using a chemical strip or oxygen ashing.

In one embodiment, etching the layer of the first dielectric material 40 provides a pillar 40a of the first dielectric material having dimensions dictated by the trimmed photoresist mask 50a. In one embodiment, the pillar 40a has a sublithographic width $W_3$. In one embodiment, the width $W_3$ of the pillar 40a is less than 100 nm. In another embodiment, the width $W_3$ of the pillar 40 ranges from about 30 nm to about 80 nm. In a further embodiment, the width $W_3$ of the pillar 40 ranges from about 10 nm to about 50 nm.

Figure 5:
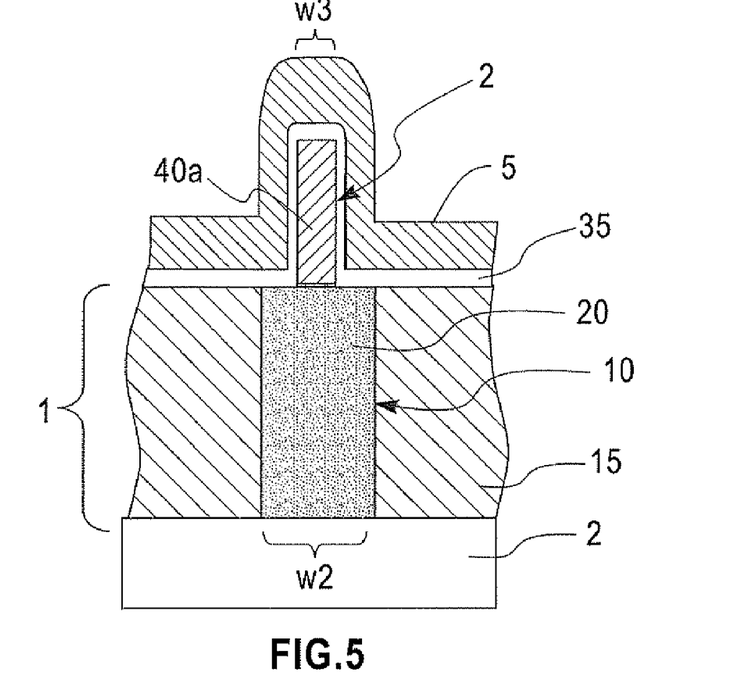
FIG. 5 is a side cross sectional view depicting one embodiment of depositing an electrically conductive material on the exterior surface of the pillar, the upper surface of the at least one metal stud that is not underlying the pillar, and the upper surface of the interlevel dielectric layer; and depositing a layer of a spacer material atop the electrically conductive material, in accordance with the present invention.

Referring to FIG. 5, in one embodiment, the electrically conductive material 35 is then deposited atop the vertical (also referred to as sidewalls 2) and horizontal surfaces of the pillar 40a, as well as the exposed surfaces of the metal stud 20 and the layer of the interlevel dielectric material 15. In one embodiment, the electrically conductive material 35 is a barrier metal. In one embodiment, the electrically conductive material 35 is a substantially conformal layer. The term "conformal layer" denotes a layer having a thickness that does not deviate from greater than or less than 20% of an average value for the thickness of the layer. In one embodiment, the electrically conductive material 35 may comprise TiN or TaN. In one embodiment, the electrically conductive material 35 may have a thickness ranging from about 2 nm to about 50 nm. In another embodiment, the electrically conductive material 35 may have a thickness on the order of about 10 nm. In one embodiment, the electrically conductive material 35 may be deposited by sputter deposition. In another embodiment, the electrically conductive material 35 may be deposited by chemical vapor deposition. Variations of CVD processes include, but are not limited to, Atmospheric Pressure CVD (APCVD), Low Pressure CVD (LPCVD), Plasma Enhanced CVD (EPCVD), Metal-Organic CVD) (MOCVD) and combinations thereof may also be employed.

Still referring to FIG. 5, in one embodiment, following the formation of the electrically conductive material 35, a spacer material 5 is formed atop the electrically conductive material 35, wherein the spacer material 5 may be formed from a similar composition and deposition and/or growth method that is used in providing the layer of the first dielectric material 40 or the interlevel dielectric material 15, as described above. In one embodiment, the spacer material 5 may comprise a dielectric such as a nitride, oxide, oxynitride, or a combination thereof. In one embodiment, the spacer material may be composed of silicon nitride (SiN). In one embodiment, the composition of the spacer material 5 is selected to provide etch selectivity to the layer of the interlevel dielectric material 15.

Figure 6:
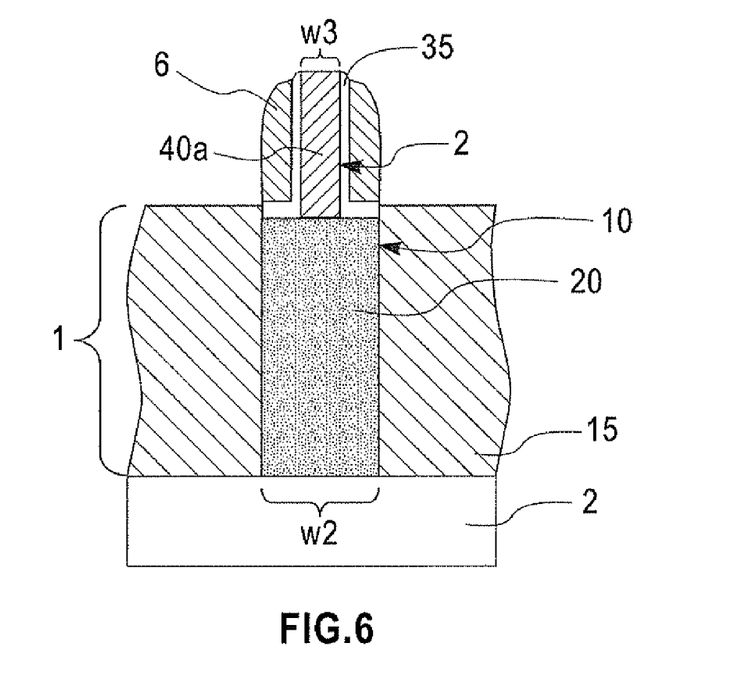
FIG. 6 is a side cross sectional view depicting one embodiment of etching the layer of the spacer material to form spacers abutting the electrically conductive material that is present on the sidewalls of the pillar of the first dielectric material, in accordance with the present invention.

Following deposition of the spacer material 5, spacer 6 is formed abutting the portion of the electrically conductive material 35 that is present on the sidewalls 2 of the pillar of the first dielectric material 40a, as depicted in FIG. 6. In one embodiment, the spacer 6 is formed from the spacer material 5 using an anisotropic etch process including, but not limited to: reactive ion etch. In one embodiment, the reactive ion etch includes an etch chemistry for removing the spacer material 5 selective to the electrically conductive material 35. In one embodiment when the spacer material 5 is composed of silicon nitride (SiN) and the electrically conductive material 35 is composed of titanium nitride (TiN) the etch chemistry is composed of $Ar/CHF_3/Cl_2$. In one embodiment, the edge of the spacer 6 opposite the spacer's face that is abutting the electrically conductive material 35 is aligned to the sidewall of the via 10 in which the metal stud 20 is positioned.

In one embodiment, the spacer 6 is used as an etch mask to remove the exposed portions of the electrically conductive material 35. In one embodiment, the spacer 6 protects the portion of the electrically conductive material 35 that is present, i.e., in direct physical contact with, the sidewalls 2 of the pillar 40a of the first dielectric material and the portion of the electrically conductive material 35 overlying the metal stud 20, wherein the portion of the electrically conductive material 35 that is not underlying the spacers 6 is exposed, such as the portion of the electrically conductive material 35 that is overlying the layer of the interlevel dielectric material 15. In one embodiment, the exposed portion of the electrically conductive material 35 is removed by an etch process that removes the electrically conductive material 35 selective to the metal stud 20 and the spacer 6. In one embodiment, the exposed portion of the electrically conductive material 35 is removed by an anisotropic etch step, such as reactive ion etch in a $Cl_2/Ar/CHF_3$ based etch chemistry.

Figure 7:
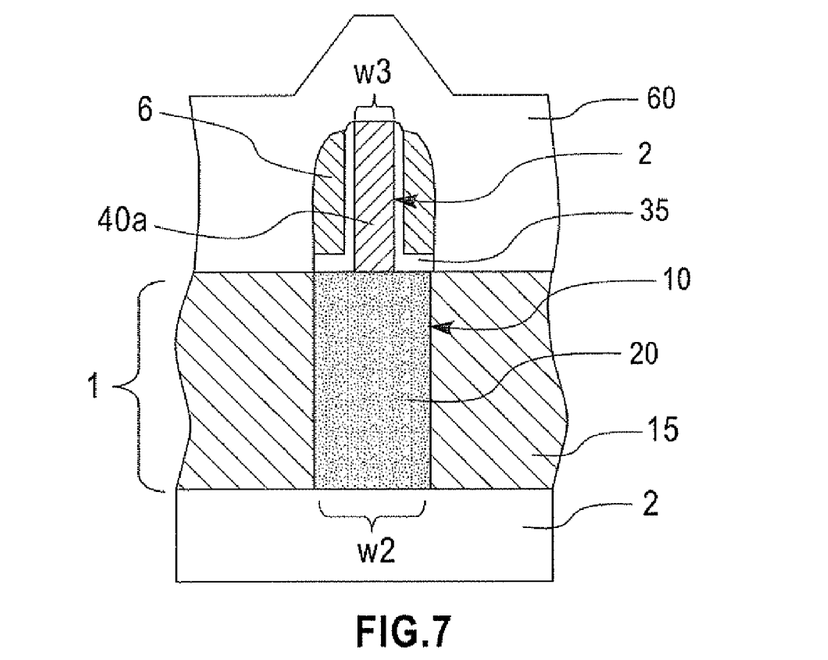
FIG. 7 is a side cross sectional view depicting one embodiment of depositing a layer of a second dielectric material, in accordance with the present invention.

Referring to FIG. 7, in a following process step, a layer of a second dielectric material 60 is formed atop the structure depicted in FIG. 6 using a deposition process. In one embodiment, the deposition process includes chemical vapor deposition (CVD). Variations of CVD processes include, but are not limited to, Atmospheric Pressure CVD (APCVD), Low Pressure CVD (LPCVD), Plasma Enhanced CVD (EPCVD), Metal-Organic CVD (MOCVD) and combinations thereof may also be employed. In one embodiment, the chemical vapor deposition (CVD) process may be high density plasma chemical vapor deposition. In one embodiment, the layer of the second dielectric material 60 may comprise a dielectric such as a nitride, oxide, oxynitride, or a combination thereof. In one embodiment, the layer of the second dielectric material 60 may be composed of silicon nitride (SiN).

Figure 8:
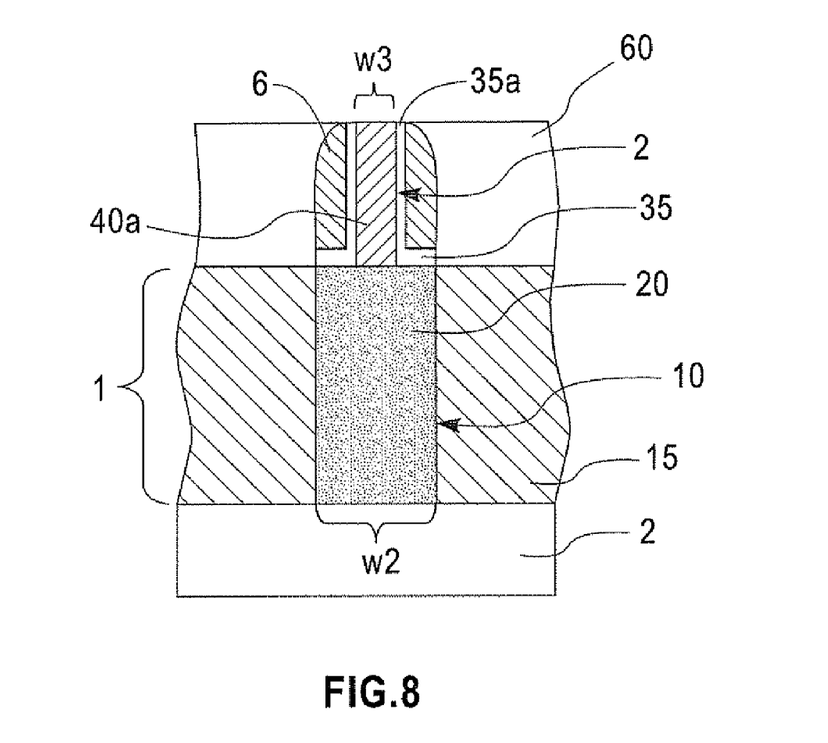
FIG. 8 is a side cross sectional view depicting one embodiment of a planarization step to expose an upper surface of the electrically conductive material, in accordance with the present invention.

FIG. 8 depicts one embodiment of a planarization process to expose an upper surface 35a of the electrically conductive material 35, in accordance with the present invention. As used herein, "Planarization" is a material removal process that employs at least mechanical forces, such as frictional media, to produce a planar surface. In one embodiment, the planarization process includes chemical mechanical planarization (CMP). "Chemical Mechanical Planarization" is a material removal process using both chemical reactions and mechanical forces to remove material and planarize a surface.

The planarization process is continued until an upper surface 35a of the electrically conductive material 35 is exposed. In one embodiment, the exposed upper surface 35a of the electrically conductive material 35 provides electrical contact to a subsequently formed memory cell. In one embodiment, the planarization process exposes the upper surface of the first dielectric material that provides the pillar 40a.

Following the formation of the electrode, a memory device for non-volatile or volatile memory may be provided in electrical contact to the exposed surface of the electrically conductive material 35a, wherein the memory device may include a resistive memory or phase change memory element. Although, the following description is directed to a phase change memory cell element, the above-described electrode is suitable for any memory cell type including volatile and non-volatile memory cell types.

Figure 9:
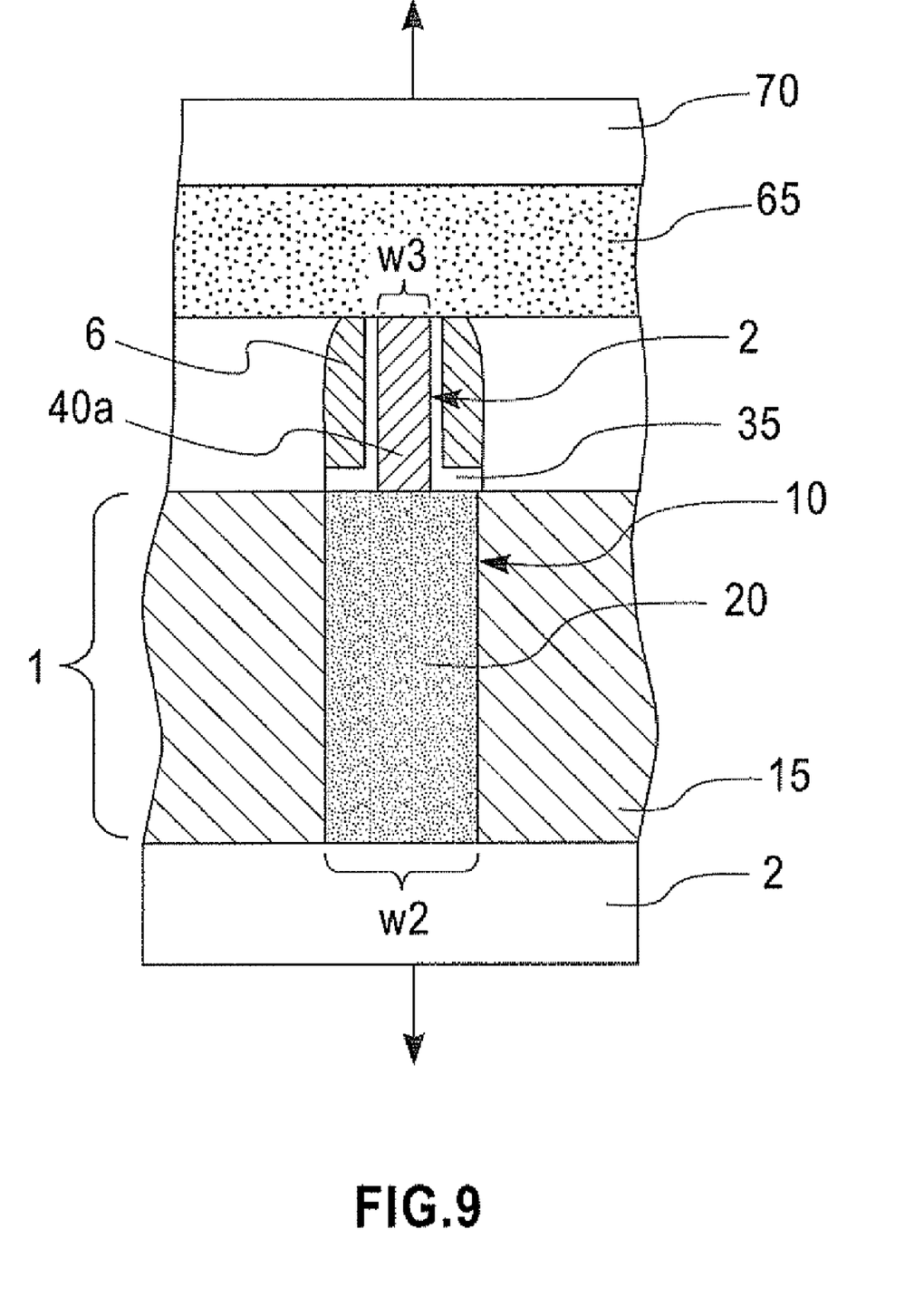
FIG. 9 is a side cross sectional view depicting forming a phase change material memory cell in electrical contact with the exposed upper surface of the electrically conductive material in accordance with one embodiment the present invention.

FIG. 9 depicts one embodiment of forming a phase change material memory cell in electrical contact with the exposed upper surface of the electrically conductive material 35. In one embodiment, forming the phase change-memory cell includes depositing a phase change material 65 atop the layer of the second dielectric material 60, the exposed upper surface 35a of the electrically conductive material 35 and the upper surface of the pillar 40a. In one embodiment, the thickness of the phase change material 65 may range from about 10 nm to about 400 nm. In one embodiment, deposition of the phase change material may include blanket deposition of the phase change material 65 followed by planarization. In one embodiment, the phase change material is isolated from adjacent electrical contacts by reactive ion etching.

In one embodiment, the phase change material 65 may be switched from an amorphous phase to a crystalline phase. When in an amorphous state, the phase change material 65 exhibits a high resistivity, typically ranging from about $10^2$ ohm-m to about $10^4$ ohm-m. When in a crystalline state, the phase change material 65 is more conductive, exhibiting a lower resistivity typically ranging from about $10^{-5}$ ohm-m to about $10^{-2}$ ohm-m. In one embodiment, the phase change material 65 may comprise chalcogenide alloys. The term "chalcogenide" is used herein to denote an alloy or compound material, which contains at least one element from Group VI of the Periodic Table of Elements. Illustrative examples of chalcogenide alloys that can be employed herein include, but are not limited to, alloys of Te or Se with at least one of the elements of Ge, Sb, As, Si. In other embodiments, the phase change material is made of any suitable material including one or more of the elements Te, Ga, In, Se, and S. In one embodiment, the phase change material liner has a composition of $Ge_2Sb_2Te_5$ (GST). Although chalcogenides are a group of materials commonly utilized as phase change material, some phase change materials, such as GeSb, do not utilize, chalcogenides. Thus, a variety of materials can be used in a phase change material cell as long as they can retain separate amorphous and crystalline states of distinct resistivity.

In one embodiment, a phase change material 65 composed of GST when at a temperature of about 25° C. is in an amorphous phase. As the temperature of the GST phase change material is increased to about 125° C. to about 150° C., the resistivity of the phase change material decreases representing the transition temperature for a phase change from an amorphous phase to Face Center Cubic (FCC) phase. Further increases in the temperature of the GST phase change material to greater than about 180° C. result in further decreases in resistivity, which result from a phase change from the Face Centered Cubic (FCC) phase to a Hexagonal (Hex) phase of the GST. When the temperature of the GST phase change material is increased above the melting temperature (approximately 620° C.), the GST phase change material melts and upon quench returns to the amorphous solid phase. Quench denotes solidification in a time period on the order of about 0.5 to about 50 nanoseconds.

Still referring to FIG. 9, in one embodiment of the present invention, a barrier metal 70 is formed atop the phase change material 65. In one embodiment the barrier metal 70 is TiN, TaN or a combination thereof. In one embodiment, the barrier metal 70 is blanket deposited by a physical deposition process, such as sputtering. In another embodiment, the barrier metal 70 may be deposited by chemical vapor deposition. In one embodiment, the layer of barrier metal 70 may have a thickness ranging from about 20 nm to about 200 nm. Following deposition, the barrier metal 70 is patterned and etched to correspond to the phase change material 65.

While the present invention has been particularly shown and described with respect to the preferred embodiments thereof, it will be understood by those skilled in the art that the foregoing and other changes in forms of details may be made without departing form the spirit and scope of the present invention. It is therefore intended that the present invention not be limited to the exact forms and details described and illustrated, but fall within the scope of the appended claims.

What is claimed:

1. A method of forming an electrode comprising:
   providing at least one metal stud present in a layer of an interlevel dielectric material;
   forming a pillar of a first dielectric material atop the at least one metal stud;
   forming an electrically conductive material atop the layer of the interlevel dielectric material and an exterior surface of the pillar of the first dielectric material, wherein a portion of the electrically conductive material is in electrical communication with the at least one metal stud;
   forming a layer of a second dielectric material atop the electrically conductive material and the substrate; and
   removing a portion of the layer of the second dielectric material to expose the upper surface of the electrically conductive material that is present on the sidewall of the pillar of the first dielectric material.

2. The method of claim 1, wherein the forming of the pillar of the first dielectric material atop the at least one metal stud comprises:
   depositing a layer of the first dielectric material atop the substrate;
   depositing a photoresist layer atop the layer of the first dielectric material;
   patterning the photoresist layer to protect a portion of the layer of the first dielectric material that is overlying a portion of the at least one metal stud, wherein a remaining portion of the layer of the first dielectric material is exposed; and
   etching the remaining portion of the layer of the first dielectric material.

3. The method of claim 2, wherein following the patterning of the photoresist layer, the method further comprises trimming the photoresist layer that is protecting the portion of the first dielectric material, wherein a width of a trimmed photoresist layer is less than the width of the at least one metal stud.

4. The method of claim 3, wherein trimming comprises isotropic reactive ion etching.

5. The method of claim 1, wherein forming the electrically conductive material atop the at least the layer of the interlevel dielectric material and the exterior surface of the pillar includes a conformal deposition process.

6. The method of claim 5, wherein the forming of the electrically conductive material further comprises forming the electrically conductive material atop an upper surface of the at least one metal stud that is not underlying the pillar of the first dielectric material.

7. The method of claim 1, wherein the electrically conductive material comprises a barrier metal.

8. The method of claim 7, wherein the electrically conductive material comprises TiN.

9. The method of claim 1, wherein the at least one metal stud comprises W.

10. The method of claim 1, wherein the forming of the layer of the second dielectric material atop the electrically conductive material and the layer of the interlevel dielectric material comprises:
    forming spacers abutting the electrically conductive material present on the sidewalls of the pillar of the first dielectric material;
    patterning the electrically conductive material and depositing the layer of the second dielectric material by high density plasma chemical vapor deposition.

11. The method of claim 1, wherein the removing of the portion of the layer of the second dielectric material to expose the upper surface of the electrically conductive material that is present on the sidewall of the pillar of the first dielectric material comprises planarizing the layer of the second dielectric material until the upper surface of the pillar of the first dielectric material is exposed.

12. The method of claim 11, wherein planarizing the layer of the second dielectric material comprises chemical mechanical polishing of the layer of the second dielectric material and the portion of the electrically conductive material that is present on an upper surface of the pillar of the first dielectric material.

13. A method of manufacturing a memory device comprising:
    providing at least one metal stud present in a layer of an interlevel dielectric material;
    forming a pillar of a first dielectric material atop the at least one metal stud;
    depositing an electrically conductive material atop the layer of the interlevel dielectric material and an exterior surface of the pillar of the first dielectric material, wherein a portion of the electrically conductive material is in electrical communication with the at least one metal stud;
    forming a layer of a second dielectric material atop the electrically conductive material and the layer of interlevel dielectric material;
    removing a portion of the layer of the second dielectric material to expose an upper surface of the electrically conductive material that is present on a sidewall of the pillar of the first dielectric material; and
    forming a phase change memory cell in contact with the upper surface of the electrically conductive material.

14. The method of claim 13, wherein the at least one metal stud comprises W and the electrically conductive material comprises TiN.

15. The method of claim 13, wherein the layer of the first dielectric material comprises a boron phosphor silicate glass (BPSG) oxide and the layer of the second dielectric material comprises a silicon nitride.

16. The method of claim 13, wherein the layer of the first dielectric material has a thickness ranging from 20 nm to about 300 nm and the layer of the second dielectric material has a thickness ranging from about 30 nm to about 500 nm.

17. The method of claim 13, wherein the removing of the portion of the layer of the second dielectric material to expose the upper surface of the electrically conductive material that is present on the sidewall of the pillar of the first dielectric material comprises planarizing the layer of the second dielectric material until the upper surface of the pillar of the first dielectric material is exposed.

18. The method of claim 13, wherein forming the phase change memory cell comprises depositing a phase change material with the upper surface of the electrically conductive material.

19. The method of claim 18, wherein the phase change material comprises Ge, Sb, Te or a combination thereof.

* * * * *